(12) United States Patent
Tamura

(10) Patent No.: US 7,929,312 B2
(45) Date of Patent: Apr. 19, 2011

(54) DEVICE MOUNTING STRUCTURE AND DEVICE MOUNTING METHOD

(75) Inventor: Masahiro Tamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/263,853

(22) Filed: Nov. 3, 2008

(65) Prior Publication Data
US 2009/0122495 A1 May 14, 2009

(30) Foreign Application Priority Data
Nov. 12, 2007 (JP) .................. 2007-293062

(51) Int. Cl.
*H05K 7/00* (2006.01)
(52) U.S. Cl. .................... 361/760; 361/728; 361/761
(58) Field of Classification Search .................. 361/760, 361/761, 720
See application file for complete search history.

(56) References Cited

U.S. PATENT DOCUMENTS

| | | | | |
|---|---|---|---|---|
| 3,784,884 A | * | 1/1974 | Zoroglu ................... | 257/664 |
| 3,943,556 A | * | 3/1976 | Wilson .................... | 257/717 |
| 3,946,428 A | * | 3/1976 | Anazawa et al. .......... | 257/664 |
| 4,172,261 A | * | 10/1979 | Tsuzuki et al. ............ | 257/717 |
| 5,384,683 A | * | 1/1995 | Tsunoda .................. | 361/313 |
| 6,945,729 B2 | * | 9/2005 | Yasuda .................... | 403/408.1 |
| 7,054,159 B2 | * | 5/2006 | Nakamura ............... | 361/719 |
| 2004/0226743 A1 | * | 11/2004 | Fang ....................... | 174/260 |
| 2004/0264114 A1 | * | 12/2004 | Hachiya .................. | 361/676 |
| 2008/0296047 A1 | * | 12/2008 | Kaji ........................ | 174/252 |

FOREIGN PATENT DOCUMENTS

| | | |
|---|---|---|
| JP | 7-14949 | 1/1995 |
| JP | 8-264910 | 10/1996 |
| JP | 9-139450 | 5/1997 |
| JP | 9-232715 | 9/1997 |
| JP | 2003-188461 | 7/2003 |
| JP | 2003-289118 | 10/2003 |

* cited by examiner

*Primary Examiner* — Tuan T Dinh
*Assistant Examiner* — Andargie M Aychillhum
(74) *Attorney, Agent, or Firm* — Scully, Scott, Murphy & Presser, P.C.

(57) ABSTRACT

The present invention provides a device mounting structure and a device mounting method in which the short circuit can be prevented between a device lead part and a device ground part when the reflow process is executed. Thus, in the device mounting structure of the present invention, the device is contained in an aperture part provided in a wired board on a heat-radiating plate, a device main part of the device being fixed on the device ground part, a device lead part extending from opposing sides of the device main part is connected to a wiring part on the wired board, and an internal wall of the aperture part positioned just under the device lead part and the device ground part positioned on the heat-radiating plate are separated by a predetermined distance.

14 Claims, 3 Drawing Sheets

F I G . 5
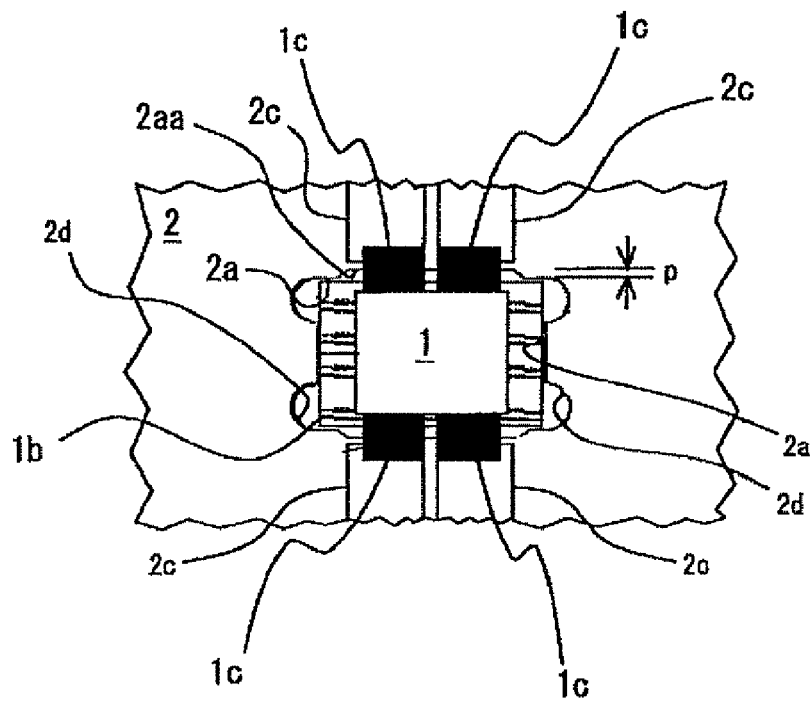
F I G . 6
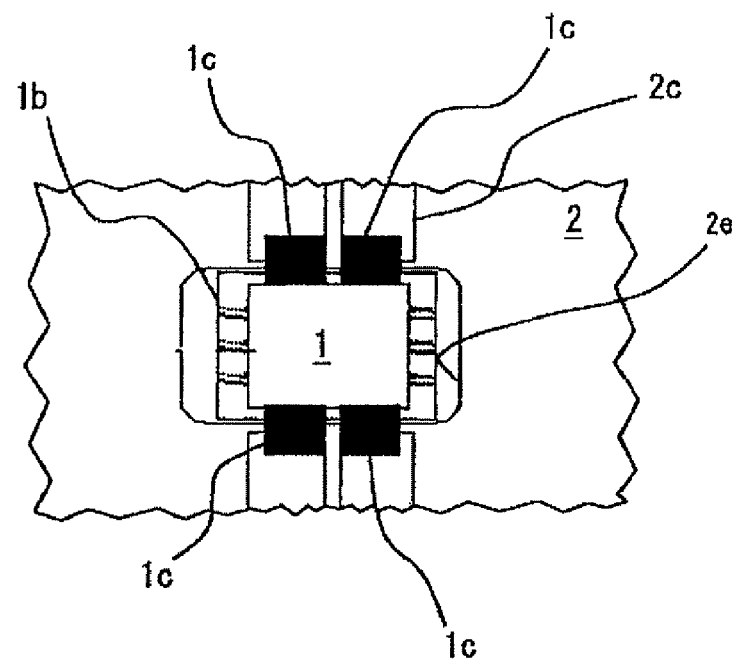

DEVICE MOUNTING STRUCTURE AND DEVICE MOUNTING METHOD

This application is based upon and claims the benefit of priority from Japanese patent application No. 2007-293062, filed on Nov. 12, 2007, the disclosure of which is incorporated herein in its entirety by reference.

BACKGROUND OF THE INVENTION

1. Field of the Invention

The present invention relates to a device mounting structure and a device mounting method.

2. Description of the Related Art

In a mounting method for a power device (hereinafter, referred to as a device) for the RF (Radio Frequency), a bonding method, which is used to bond a heat-radiating surface of a device main part to a heat-radiating plate, has become more important along with the increasing high power output. To assure a steady bonding area of the device, such a method is currently implemented that the device is soldered to the heat-radiating plate. In the method, it is necessary to fix an RF board and the heat-radiating plate to mount the device to the RF board and the heat-radiating plate at the same time.

While a soldering method or a resin method is available as a fixing method, the cost is high. It is hard to fix a position for mounting the device when soldering the device, and a lead of the device and a wiring pattern are frequently different to each other in the height. Thus, a manual production process is increased to mount such a device, and the process cost for the heat-radiating plate is also increased, so that a process method for the heat-radiating plate and the PWB has been studied.

The related technique corresponds to Patent documents 1 to 6:

Patent document 1: Japanese Patent Laid Open Publication No. 2003-188461;
Patent document 2: Japanese Patent Laid Open Publication No. 2003-289118;
Patent document 3: Japanese Patent Laid Open Publication No. 7-14949;
Patent document 4: Japanese Patent Laid Open Publication No. 8-264910;
Patent document 5: Japanese Patent Laid Open Publication No. 9-139450; and
Patent document 6: Japanese Patent Laid Open Publication No. 9-232715.

The invention described in the Patent document 1 corresponds to a semiconductor laser driving apparatus provided with a print board in which a semiconductor laser is mounted. This semiconductor laser is mounted as a unity on the heat-radiating plate with an enough area for covering a circuit that is mounted on the print board, and is related to noise generation. This semiconductor laser is mounted on the print board so that the heat-radiating plate covers the circuit related to the noise generation on the printed board.

According to this semiconductor laser driving apparatus, it is possible to cause the heat-radiating plate to function as not only a heat-radiating component but also a shield for an emission noise.

In the Patent document 2, in such a mounting structure that a heat sink is provided in a rear side of a board, a plate containing a bottom side of a circuit part with the board, or such a plate and at least one metal plate are provided between the board and the heat sink so that the bottom side of the circuit part arranged on a surface of the board is contacted to the heat sink. In this mounting structure, the bottom part of the circuit part is contained by the plate, or the plate and the metal plate, and the bottom part of the circuit part is directly or indirectly connected to the heat sink.

According to this mounting structure, it is possible to transfer the heat generated in the circuit part from the bottom side to the heat sink, and to radiate the transferred heat, and it is possible to apply the heat sink, in which a surface is flat, and a type is one, regardless of the size of the bottom side of the circuit part.

The invention described in the Patent document 3 corresponds to a semiconductor module in which a peripheral circuit of a semiconductor element such as a high-frequency transistor is formed on a ceramic board, and the ceramic board is soldered to the heat-radiating plate. In this semiconductor module, the ceramic board includes a through hole in an area for mounting the semiconductor element such as the high-frequency transistor with a large amount of generated heat. The heat-radiating plate includes a projection part in a position of the heat-radiating plate, which corresponds to an area for mounting the semiconductor element. The semiconductor element such as the high-frequency transistor is directly bonded to the projection part of the heat-radiating plate through the through hole of the ceramic board.

According to this semiconductor module, a convex part is provided in the heat-radiating plate, the transistor is directly mounted to the convex part through the through hole of the ceramic board, so that it is possible to improve the heat-radiating effect and the quality.

The invention described in the Patent document 4 corresponds to a production method, configured with the following processes (a) to (d), for producing the print wired board with the heat-radiating plate. (a) A process in which release paper, to which adhesive is applied, is bonded, through this adhesive, to another side of an insulation plate of the print wired board with a wiring pattern on one side of the insulation plate. (b) A process in which the through hole is formed at a high power part mounting position of the print wired board to which the release paper is bonded. (c) A process for peeling the release paper. (d) A process for bonding, with the adhesive, the heat-radiating plate to the insulation plate.

According to this production method, a process is not necessary, in which the convex part is conventionally formed in the metal heat-radiating plate according to the position of the through hole formed in the print wired board, and an easy production method and an easy mounting method can be realized. In addition, the metal heat-radiating plate can be provided, with the both side bonding means, in the print wired board without being positioned to the through hole provided for mounting a high power part package.

The invention described in the Patent document 5 corresponds to a fixing method for fixing the heat sink for radiating the heat generated in a semiconductor integrated apparatus. In this fixing method, the heat sink, in which a screw hole is formed at a predetermined position, is arranged on the semiconductor integrated apparatus that is soldered to be arranged on the board, and is passed, from a back side of the board, through a compression coil with a predetermined spring force and the through hole provided in the board. A screw component is screwed in the screw hole of the heat sink, and by the spring force of the compression coil biasing the screw component in a direction of escaping from the board, the heat sink is closely fixed on the upper side of the semiconductor integrated apparatus.

According to this fixing method for fixing the heat sink, the heat sink is, by the spring force of the compression coil, flexibly and closely fixed on the upper side of the semiconductor integrated apparatus. Thereby, it is possible to avoid such a condition that the stress is applied to the semiconductor integrated apparatus, and to prevent a disadvantage such as a solder crack and a fold of a lead pin. In addition, the productivity is also more excellent than the conventional bonding method.

The invention described in the Patent document 6 corresponds to a mounting method for mounting a power transistor when a high frequency power amplifying module is produced. In this mounting method, a circuit board is mounted on a module heat-radiating plate to which cream solder is applied, and the bear chip-like power transistor with the heat-radiating plate is dropped down in a dropping-down hole provided in the circuit board, and is reflow-soldered. In this mounting method, when the cream solder is applied to the module heat-radiating plate, a not-applied part is provided in a part of a part corresponding to the dropping-down hole of the circuit board.

According to this mounting method for mounting the power transistor, a direction of a gate G to a drain D of the power transistor is stabilized at a certain position in the dropping-down hole, thereby, it is possible to stabilize the amplification characteristic, and to largely reduce adjusting work for a circuit constant.

However, in the techniques described in the above Patent documents 1 to 6, when the reflow process is applied to the wired board, the short circuit may be induced between a device lead part and a device ground part of the device.

SUMMARY

The present invention is made in consideration of the above condition, and an exemplary object of the present invention is to provide the device mounting structure and the device mounting method in which the short circuit can be prevented which is induced between the device lead part and the device ground part of the device when the reflow process is applied.

The present invention includes the following characteristics to achieve such an object.

<Device Mounting Structure>

In the device mounting structure according to the present invention, the device is contained in an aperture part provided in a wired board on a heat-radiating plate, a device main part of the device being fixed on a device ground part, the device lead part extending from opposing sides of the device main part is connected to a wiring part on the wired board, and an internal wall of the aperture part positioned just under the device lead part and the device ground part positioned on the heat-radiating plate are separated by a predetermined distance.

<Device Mounting Method>

The device mounting method according to the present invention includes containing a device in an aperture part provided in a wired board on a heat-radiating plate, a device main part of the device being fixed on a device ground part, connecting a device lead part extending from opposing sides of the device main part to the wiring part on the wired board, and separating an internal wall of the aperture part positioned just under the device lead part from the device ground part positioned on the heat-radiating plate by a predetermined distance.

BRIEF DESCRIPTION OF THE DRAWINGS

FIG. 5 is a plain view illustrating a fifth exemplary embodiment of the mounting structure of the device according to the present invention; and FIG. 6 is a plain view of the mounting structure of the device according to the present invention.

EXEMPLARY EMBODIMENT

The preferred embodiments for implementing the present invention will be described in detail below as referring to the accompanying drawings.

First Exemplary Embodiment

Figure 1:
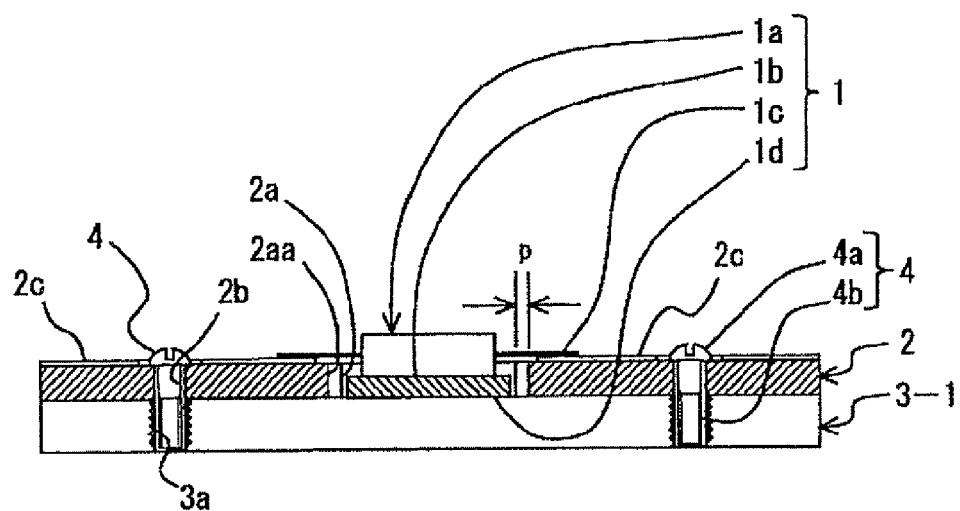
FIG. 1 is a structural view illustrating a first exemplary embodiment of a mounting structure of a device according to the present invention.

FIG. 1 is a structural view illustrating a first exemplary embodiment of a mounting structure of a device according to the present invention.

In FIG. 1, a device main part 1*a* is contained in an aperture part 2*a*. A device lead part 1*c* extending from opposing sides of the device main part 1*a* is connected to a wiring part 2*c* on a surface of a wired board 2 (also referred to as PWB (Print Wire Board)). The wired board 2 and a heat-radiating plate 3-1 are fixed with a screw 4. A screw hole 3*a*, to which a body part 4*b* of the screw 4 is screwed, is formed by tapping in the heat-radiating plate 3-1. In the heat-radiating plate 3-1, the screw hole 3*a* is formed at a position corresponding to a through hole 2*b* of the wired board 2. The wired board 2 and the heat-radiating plate 3-1 are fixed by inserting the screw 4 to the through hole 2*b* and the screw hole 3*a*.

A device 1 including a device ground part 1*b* that heat-radiates for the heat-radiating plate 3-1 and assures a ground voltage, the device main part 1*a* fixed on the upper part of the device ground part 1*b*, and the device lead part 1*c* extending from opposing sides of the device main part 1*a*. As the device 1, for example, a high-power field effect transistor (MRF6S21100HSR3 made by Freescale Semiconductor Inc.) is used, which is referred to as a power FET, and needs a heat-radiating plate, however, a flat package-type integrated circuit may be also used.

While the wired board 2 corresponds to, for example, a glass epoxy wired board, the wired board 2 is not limited to this board, and a glass composite wired board or other print wired board may be used. The aperture part 2*a* to the extent that the device 1 can be contained, and the through hole 2*b* to the extent that the body part 4*b* of the screw 4 can be passed through are formed in the wired board 2.

In the wired board 2, a shape of the aperture part 2*a* is formed so as to contact a part of each lateral side of the device ground part 1*b* of the device 1. When the device 1 is contained, a concavity part is formed inside the aperture part 2*a*. Because of this concavity part, an internal wall 2*aa* of the aperture part 2*a* positioned just under the device lead part 1*c*, and the device ground part 1*b* are separated by a predetermined distance (p in FIG. 1). The concavity part is large to the extent that the wiring part 2*c* of the wired board 2 does not short to the device ground part 1*b* of device 1 when solder-reflow is executed.

In the aperture part 2*a* of the wired board 2, a corner part in a side of the device ground part 1*b* is, for example, chamfered in a half circle shape. Thereby, the corner part of the device ground part 1*b* is prevented from being stressed.

While the screw 4, whose head part 4*a* is a pan-type, is illustrated, the head part 4*a* is not limited to the pan-type, but may be any one of a truss-type, a plate-type, a round plate-type, a binding-type, and a cheese-type. A hole part of the screw 4 may be any one of a straight slot-type, a cross-type, a Phillips/flat-type, and a hexagonal-type. While the number of the screws 4 is two in FIG. 1, the number is not limited to two.

Tapping is applied at a position of the heat-radiating plate 3-1, which corresponds to through hole 2*b* of the wired board 2, and the screw hole 3*a* is formed. Material of the heat-radiating plate 3-1 corresponds to, for example, a gold-plated copper plate, and a tinned copper plate.

As described above, according to the present embodiment, the device 1, whose device main part 1*a* is fixed on the device ground part 1*b*, is contained in the aperture part 2*a* provided in the wired board 2 on the heat-radiating plate 3-1. The device lead part 1*c* extending from opposing sides of the device main part 1*a* is connected to the wiring part 2*c* on the wired board 2. The internal wall 2*aa* of the aperture part 2*a* positioned just under the device lead part 1*c*, and the device ground part 1*b* positioned on the heat-radiating plate 3-1 are separated by a predetermined distance p. Thereby, the short circuit can be prevented which is induced between the device lead part and the device ground part of the device when the reflow process is executed.

According to the present embodiment, the heat-radiating plate 3-1 may be shaved. Thereby, a nut for tightening the screw 4 becomes unnecessary.

Second Exemplary Embodiment

Figure 2:
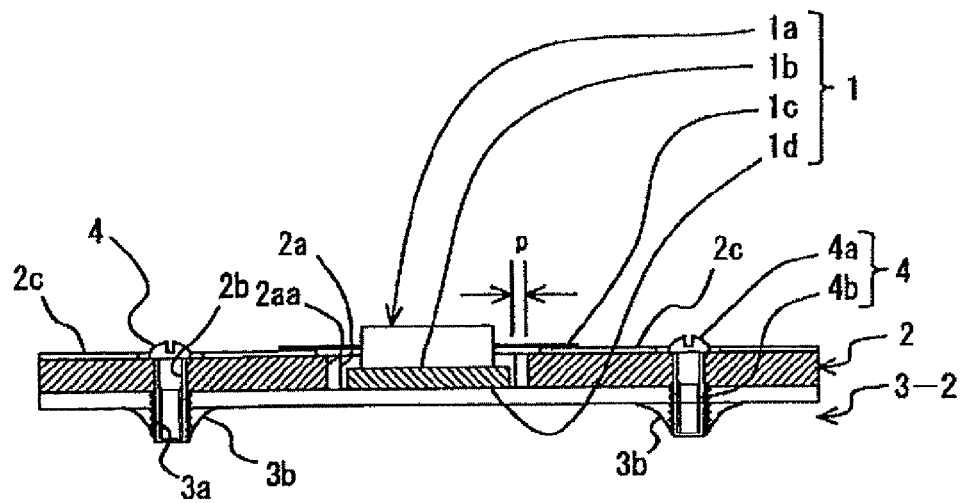
FIG. 2 is a structural view illustrating a second exemplary embodiment of the mounting structure of the device according to the present invention.

FIG. 2 is a structural view illustrating a second exemplary embodiment of the mounting structure of the device according to the present invention.

A different point between the second exemplary embodiment illustrated in FIG. 2 and the first exemplary embodiment illustrated in FIG. 1 is that the heat-radiating plate 3-2 illustrated in FIG. 2 is thinner than the heat-radiating plate 3-1 illustrated in FIG. 1, and burring is applied to the heat-radiating plate 3-2 illustrated in FIG. 2.

That is, in the device mounting structure illustrated in FIG. 2, the device main part 1*a* is contained in the aperture part 2*a*, the wired board 2, in which the device lead part 1*c* extending from opposing sides of the device main part 1*a* is connected to the wiring part 2*c*, is fixed with the screw 4 to the heat-radiating plate 3-2. The screw hole 3*a*, to which the body part 4*b* of the screw 4 is screwed, is formed by burring in the heat-radiating plate 3-2.

As described above, according to the present embodiment, the device 1, whose device main part 1*a* is fixed on the device ground part 1*b*, is contained in the aperture part 2*a* provided in the wired board 2 on the heat-radiating plate 3-2. The device lead part 1*c* extending from opposing sides of the device main part 1*a* is connected to the wiring part 2*c* on the wired board 2. The internal wall 2*aa* of the aperture part 2*a* positioned just under the device lead part 1*c*, and the device ground part 1*b* positioned on the heat-radiating plate 3-2 are separated by a predetermined distance p. Thereby, the short circuit can be prevented which is induced between the device lead part and the device ground part of the device when the reflow process is executed.

According to the present embodiment, burring may be applied to the heat-radiating plate 3-2. Thereby, a nut for tightening the screw 4 to the heat-radiating plate 3-2 becomes unnecessary.

Third Exemplary Embodiment

Figure 3:
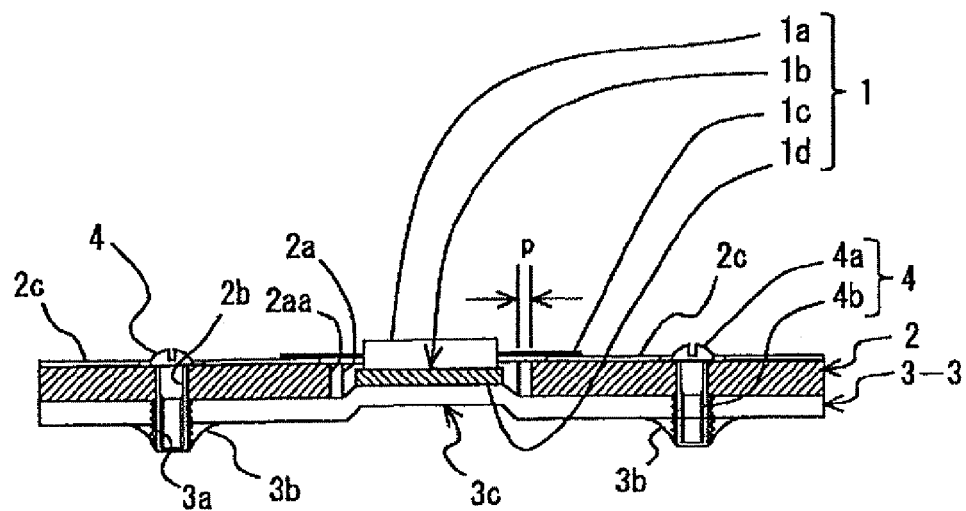
FIG. 3 is a structural view illustrating a third exemplary embodiment of the mounting structure of the device according to the present invention.

FIG. 3 is a structural view illustrating a third exemplary embodiment of the mounting structure of the device according to the present invention.

A different point between the third exemplary embodiment illustrated in FIG. 3 and the second exemplary embodiment illustrated in FIG. 2 is that such a device is mounted that the thickness from the device lead part to a heat-radiating side of the device main part 1*a* is smaller than that of the wired board 2.

That is, in the mounting structure illustrated in FIG. 3, the device main part 1*a* is contained in the aperture part 2*a*, the wired board 2, in which the device lead part 1*c* extending from opposing sides of the device main part 1*a* is connected to the wiring part 2*c*, is fixed with the screw 4 to a heat-radiating plate 3-3. In addition, a pushing out process, in which the heat-radiating plate 3-3 is pushed out in a direction of heading to the device, is applied at a mounting position of the device 1, so that a convex part is formed.

As described above, according to the present embodiment, the device 1, whose device main part 1*a* is fixed on the device ground part 1*b*, is contained in the aperture part 2*a* provided in the wired board 2 on the heat-radiating plate 3-3. The device lead part 1*c* extending from opposing sides of the device main part 1*a* is connected to the wiring part 2*c* on the wired board 2. The internal wall 2*aa* of the aperture part 2*a* positioned just under the device lead part 1*c*, and the device ground part 1*b* positioned on the heat-radiating plate 3-3 are separated by a predetermined distance p. Thereby, the short circuit can be prevented which is induced between the device lead part and the device ground part of the device when the reflow process is executed.

According to the present embodiment, burring may be applied to the heat-radiating plate 3-3. Thereby, a nut for tightening the screw 4 to the heat-radiating plate 3-3 becomes unnecessary.

According to the present embodiment, for the heat-radiating plate 3-3, the pushing out process, in which the heat-radiating plate 3-3 is pushed out in a direction of heading to the device, may be applied at the mounting position of the device 1. Thereby, when the device lead part 1*c* of the device 1 is at the lower position than the thickness of the wired board 2, that is, when the thickness from the device lead part 1*c* to the heat-radiating side of the device main part 1*a* is smaller than that of the wired board 2, the adjusting can be executed.

Fourth Exemplary Embodiment

Figure 4:
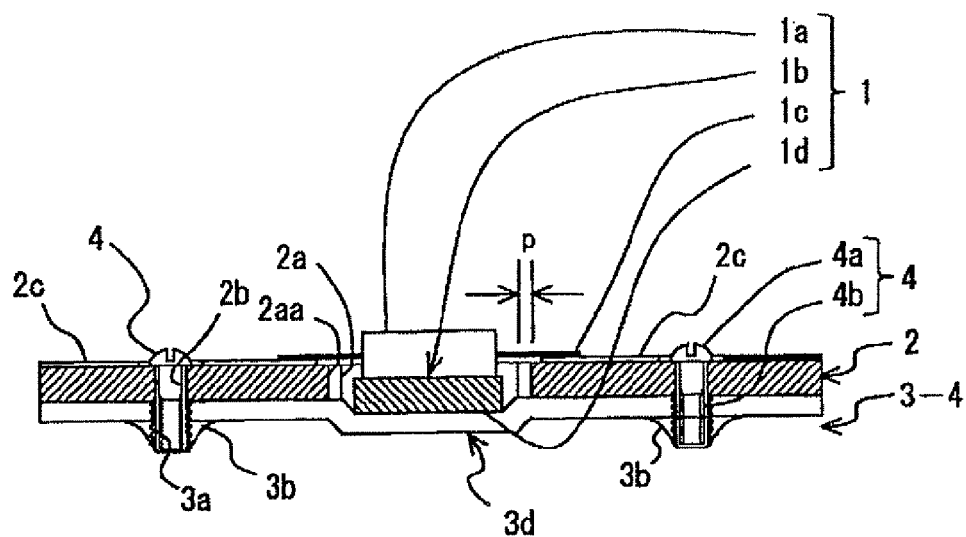
FIG. 4 is a structural view illustrating a fourth exemplary embodiment of the mounting structure of the device according to the present invention.

FIG. 4 is a structural view illustrating a fourth exemplary embodiment of the mounting structure of the device according to the present invention.

A different point between the fourth exemplary embodiment illustrated in FIG. 4 and the third exemplary embodiment illustrated in FIG. 3 is that such a device is mounted that the thickness from the device lead part to a heat-radiating side 1*d* of the device main part 1*a* is larger than that of the wired board 2.

That is, in the mounting structure illustrated in FIG. 4, the device main part 1*a* is contained in the aperture part 2*a*, the wired board 2, in which the device lead part 1*c* extending from opposing sides of the device main part 1*a* is connected to the wiring part 2c, is fixed with the screw 4 to a heat-radiating plate 3-4. In addition, a pushing out process, in which the heat-radiating plate 3-4 is pushed out in a direction of departing from a side of the device 1, is applied at the mounting position of the device 1, and a concavity part is formed.

As described above, according to the present embodiment, the device 1, whose device main part 1a is fixed on the device ground part 1b, is contained in the aperture part 2a provided in the wired board 2 on the heat-radiating plate 3-4. The device lead part 1c extending from opposing sides of the device main part 1a is connected to the wiring part 2c on the wired board 2. The internal wall 2aa of the aperture part 2a positioned just under the device lead part 1c, and the device ground part 1b positioned on the heat-radiating plate 3-4 are separated by a predetermined distance p. Thereby, the short circuit can be prevented which is induced between the device lead part and the device ground part of the device when the reflow process is executed.

According to the present embodiment, burring may be applied to the heat-radiating plate 3-4. Thereby, a nut for tightening the screw 4 to the heat-radiating plate 3-4 becomes unnecessary.

According to the present embodiment, for the heat-radiating plate 3-4, the pushing out process, in which the heat-radiating plate 3-4 is pushed out in a direction of departing from the device, may be applied at the mounting position of the device 1. Thereby, when the device lead part 1c of the device 1 is at the higher position than the thickness of the wired board 2, that is, when the thickness from the device lead part 1c to the heat-radiating side of the device main part 1a is larger than that of the wired board 2, the adjusting can be executed.

Meanwhile, the third exemplary embodiment illustrated in FIG. 3 and the fourth exemplary embodiment illustrated in FIG. 4 may be combined. Thereby, it becomes possible to mount the device, whose package shape is different, on the same wired board and the same heat-radiating plate.

Fifth Exemplary Embodiment

FIG. 5 is a plain view illustrating a fifth exemplary embodiment of the mounting structure of the device according to the present invention. FIG. 6 is a plain view of the mounting structure of the device according to the present invention.

In a device structure illustrated in FIG. 5, the wired board 2 is processed to position the device. In the mounting structure illustrated in FIG. 6, while a plain shape of the aperture part 2a is processed to be ellipsoidal. It may be also considered that the device 1 is shifted, and the device lead part 1c is shorted to the adjacent wire. Since a corner R is induced to process the wired board 2, by adding an R draft 2e as illustrated in FIG. 6, it becomes possible to eliminate the shifts of the front-back and right-left directions of the device 1 in the wired board 2, and to fix the device 1.

Since a position of the device 1 is fixed by the wired board 2, the device ground part 1b of the device 1 and the wiring part 2c may approach to each other to be shorted. Thus, a concavity part is processed around the wiring part 2c so that the internal wall 2aa just under the device lead part 1c is separated from the device ground part 1b. Thereby, the short circuit is prevented.

As described above, according to each exemplary embodiment of the present invention, the aperture part for containing the device is formed in the wired board fixed to the heat-radiating plate, and the concavity part is formed in the aperture part so that the internal wall just under the device lead part is separated from the device ground part. Thereby, it is possible to prevent the short circuit between the device lead part and the device ground part when the reflow process is executed.

Since the heat-radiating plate is shaved, the heat-radiating plate can be fixed to the wired board without a nut.

Since a concavity and convex process is applied to the heat-radiating plate, it becomes possible to mount the device whose package is different.

Since a position of the wired board is fixed, it becomes possible to solder the device and the plate by using the reflow process.

As described above, it becomes possible to mount a variety of packages of the devices on the same wired board and the same plate, so that the mounting work is reduced by soldering with the reflow process.

Each of the above exemplary embodiments of the present invention can be utilized for any apparatus in which an RF power device is soldered to the heat-radiating plate.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A device mounting structure, comprising:
   a high-power device having a device main part, a device ground part for heat-radiation being fixed to the bottom surface of the device main part and a device lead part extending from opposing sides of the device main part;
   a wired board having an aperture part for containing the high-power device, a through hole for passing a screw, and a wiring part; and
   a heat-radiating metal plate having a screw hole formed at a position corresponding to the through hole of the wired board;
   wherein the wired board and the heat-radiating metal plate are fixed by inserting a screw into the through hole and the screw hole; and
   wherein the wiring part is soldered to the device lead part on the upper surface of the wired board and the device group part is soldered to the heat-radiating metal plate.

2. The device mounting structure according to claim 1, wherein an internal wall of the aperture part positioned just under the device lead part and the device ground part positioned on the heat-radiating metal plate are separated by a predetermined distance.

3. The device mounting structure according to claim 1, wherein the internal wall of the aperture part is formed so as not to contact a part of each lateral side of the device ground part.

4. The device mounting structure according to claim 1, wherein the aperture part provided in the wired board is chambered so as not to contact part of the device ground part.

5. The device mounting structure according to claim 1, wherein the screw hole is formed by tapping or burring.

6. The device mounting structure according to claim 1, wherein a shape of the heat-radiating plate is such a shape that the mounting position of the device is pushed out in a direction of heading to the device.

7. The device mounting structure according to claim 1, wherein the shape of the heat-radiating plate is such a shape that the mounting position of the device is pushed out in a direction of departing from the device.

8. A device mounting method, comprising:
providing a high-power device having a device main part, a device ground part for heat-radiation being fixed to the bottom surface of the device main part and a device lead part extending from opposing sides of the device main part;
providing a wired board having an aperture part for containing the high-power device, a through hole for passing a screw, and a wiring part;
providing a heat-radiating metal plate having a screw hole formed at a position corresponding to the through hole of the wired board;
fixing the wired board and the heat-radiating metal plate by inserting a screw into the through hole and the screw hole; and
soldering the wiring part to the device lead part on the upper surface of the wired board and the device ground part to the heat-radiating metal plate.

9. The device mounting method according to claim 8, wherein an internal wall of the aperture part positioned just under the device lead part and the device ground part positioned on the heat-radiating metal plate are separated by a predetermined distance.

10. The device mounting method according to claim 8, wherein the internal wall of the aperture part is formed so as to contact a part of each lateral side of the device ground part.

11. The device mounting method according to claim 8, wherein the aperture part provided in the wired board is chambered so as not to contact part of the device ground part.

12. The device mounting method according to claim 8, wherein the screw hole is formed by tapping or burring.

13. The device mounting method according to claim 8, wherein a shape of the heat-radiating plate is such a shape that a mounting position of the device is pushed out in a direction of heading to the device.

14. The device mounting method according to claim 8, wherein the shape of the heat-radiating plate is such a shape that the mounting position of the device is pushed out in a direction of departing from the device.

* * * * *